(12) United States Patent
Hernandez et al.

(10) Patent No.: US 8,041,553 B1
(45) Date of Patent: Oct. 18, 2011

(54) GENERIC SOFTWARE SIMULATION INTERFACE FOR INTEGRATED CIRCUITS

(75) Inventors: Adrian M. Hernandez, Longmont, CO (US); Michael E. Darnall, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 902 days.

(21) Appl. No.: 12/040,299

(22) Filed: Feb. 29, 2008

(51) Int. Cl.
*G06F 17/50* (2006.01)

(52) U.S. Cl. ............ 703/14; 714/30; 714/733; 714/734; 716/106; 716/136; 719/324

(58) Field of Classification Search ............... 703/13–16, 703/28; 714/25, 30–33, 724, 733, 734; 716/106, 716/117, 136; 719/321, 324
See application file for complete search history.

(56) References Cited

U.S. PATENT DOCUMENTS

| | | | |
|---|---|---|---|
| 7,184,946 B2 | 2/2007 | Ballagh et al. | |
| 7,519,879 B2 * | 4/2009 | Woodward et al. | 714/724 |
| 7,546,572 B1 * | 6/2009 | Ballagh et al. | 716/138 |
| 7,707,019 B1 * | 4/2010 | Ballagh et al. | 703/13 |
| 7,747,423 B1 * | 6/2010 | Shirazi et al. | 703/13 |
| 2009/0150136 A1 * | 6/2009 | Yang | 703/13 |

OTHER PUBLICATIONS

Muhr et al., A Heterogeneous Hardware-Software Co-Simulation Environment Using User Mode Linux and Clock Suppression, Proceedings of the 2nd IEEE/ASME International Conference on Mechatronic and Embedded Systems, 2006, pp. 1-6.*
Bruce et al., Re-Usable Hardware/Software Co-verification of IP Blocks, 14th Annual IEEE International ASIC/SOC Conference, 2001, pp. 413-417.*

* cited by examiner

*Primary Examiner* — Russell W Frejd
(74) *Attorney, Agent, or Firm* — Kevin T. Cuenot (57) ABSTRACT

A computer-based system for testing a circuit design for implementation within an integrated circuit device can include a design application (205) providing simulation instructions for testing a circuit design and a simulation driver (225) receiving the simulation instructions and translating the simulation instructions into control protocol instructions specifying operations of an integrated circuit control protocol. The system can include a simulation environment (240). The simulation environment can include a communication module (245) communicating with the simulation driver, a simulation cable driver (250) receiving the control protocol instructions from the simulation driver via the communication module, and a control module (255). The simulation cable driver further can translate the control protocol instructions into signaling information corresponding to the integrated circuit control protocol. The control module can include a plurality of ports receiving the signaling information and outputting the signaling information to a device under test within the simulation environment.

20 Claims, 3 Drawing Sheets

GENERIC SOFTWARE SIMULATION INTERFACE FOR INTEGRATED CIRCUITS

FIELD OF THE INVENTION

The embodiments disclosed herein relate to integrated circuit devices (ICs). More particularly, the embodiments relate to simulating circuit designs for ICs using a generic software simulation interface.

BACKGROUND OF THE INVENTION

Circuit designs to be implemented within integrated circuit devices (ICs) typically are specified in programmatic form, e.g., using a hardware description language (HDL) as is known. The circuit designs can be thoroughly tested through simulation. Simulation refers to a process in which software-based models of the circuit design, typically specified in an HDL, are executed within a simulation environment to mimic the way the circuit design will perform when implemented within an IC. In this sense, simulation refers to a process that takes place entirely within one or more computer systems without a physical implementation of the circuit design in an IC.

Simulation typically entails the creation of a test bench, also referred to as a verification or simulation environment. A test bench refers to HDL descriptions that specify and verify the behavior of the device under test (DUT), in reference a programmatic description of the circuit design. Generating a test bench involves describing the connections, events, and test vectors for different combinations of transactions. A simulation engine is used to execute the test bench with respect to the DUT so that changes to signals and vectors can be observed over time. Typically, a test bench is implemented with a narrow goal in mind, e.g., to exercise a particular flip flop or other narrow portion of the DUT.

Since test benches are manually coded by a developer, test bench development can be a time consuming and error-prone process. As the circuit design continues to evolve, the test bench also must be modified in accordance with any changes made to the circuit design. In consequence, the maintenance of a test bench can be as time consuming and tedious of a process as first developing the test bench.

Another technique for testing circuit designs is called hardware co-simulation. Hardware co-simulation involves instantiating, e.g., synthesizing, the circuit design within an IC and conducting tests on the physical device. The IC can be disposed upon a hardware testing platform that can be coupled to a computer system. Using appropriate operational software on the computer system, various test commands can be provided from the computer system to the IC. Output from the IC can be observed and compared with expected signal output.

Simulation and hardware co-simulation both are valuable tools for circuit designers. Each technique offers a particular set of advantages. The two techniques, however, are mutually exclusive. That is, simulation and hardware co-simulation require different software suites for conducting the tests, different test cases to be developed and maintained, etc. As noted with respect to simulation, maintaining test cases, e.g., signal and vector combinations to be provided to the circuit design to invoke a particular operating state or condition, can be cumbersome. These test cases also must be developed and supported for hardware co-simulation, thereby requiring dual effort.

SUMMARY OF THE INVENTION

The embodiments disclosed herein relate to simulating circuit designs for integrated circuit devices (ICs) using a generic software simulation interface. One embodiment of the present invention can include a computer-implemented method of testing a circuit design for implementation within an IC. The method can include providing a simulation driver that communicatively links a design application with a communication module executing as part of a simulation environment for a device under test (DUT) and establishing a communication link between the design application and the communication module via the simulation driver. The method can include providing a simulation cable driver executing as part of the simulation environment that communicates with the communication module and translates control protocol instructions specifying operations of an IC control protocol into signaling information conforming to the IC control protocol. The signaling information can be output to a device under test within the simulation environment.

The computer-implemented method can include, responsive to detection of a parameter, dynamically switching between the simulation driver and a hardware driver that communicates with a hardware co-simulation system over a physical communication link. A same simulation instruction can be provided from the design application to either the simulation driver or the hardware driver according to the parameter. Test data from the simulation environment or the hardware co-simulation system can be received according to the parameter. The test data can be output.

The computer-implemented method can include translating simulation instructions from the design application into the control protocol instructions, encoding the control protocol instructions according to a communication protocol of the communication module, and communicating the encoded control protocol instructions to the communication module.

Signals output from the DUT can be monitored through a first software core embedded within the DUT. One or more operational parameters of the DUT can be set through a second software core embedded in the DUT responsive to a simulation instruction from the design application.

Another embodiment of the present invention can include a computer-based system for testing a circuit design for implementation within an IC. The system can include a design application providing instructions for testing a circuit design, a simulation driver, and a simulation environment. The simulation driver can receive the instructions from the design application and translate the simulation instructions into control protocol instructions specifying operations of an IC control protocol. The simulation environment can include a communication module communicating with the simulation driver, a simulation cable driver, and a control module. The simulation cable driver can receive the control protocol instructions from the simulation driver via the communication module and translate the control protocol instructions into signaling information corresponding to the IC control protocol. The control module can include a plurality of ports receiving the signaling information and outputting the signaling information to a DUT within the simulation environment.

The simulation driver can communicate with the communication module using a selected communication protocol. The simulation driver further can encode the control protocol instructions according to the selected communication protocol and decode test data received from the simulation environment according to the selected communication protocol. In one embodiment, the IC control protocol can be Joint Test Action Group (JTAG). The signaling information can include test clock input signals, test mode select input signals, and test data input signals. The control module can include a JTAG controller and the plurality of ports can include a test clock port, a test mode select port, and a test data input port. The plurality of ports also can include a test data output port through which test data from the simulated DUT can be output.

The computer-based system further can include a hardware driver. Responsive to detection of a parameter, the design application can dynamically select, and provide the instructions to, either the hardware driver or the simulation driver, thereby establishing communication with the simulation environment or a hardware testing system.

Yet another embodiment of the present invention can include a computer program product including a computer-usable medium having computer-usable program code that, when executed by an information processing system, causes the information processing system to perform the various steps and/or functions disclosed herein.

DETAILED DESCRIPTION

While the specification concludes with claims defining the features of the invention that are regarded as novel, it is believed that the invention will be better understood from a consideration of the description in conjunction with the drawings. As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting but rather to provide an understandable description of the invention.

The embodiments disclosed herein relate to a generic software simulation interface for integrated circuit devices (ICs). More particularly, the embodiments disclosed herein facilitate the use of a software-based design tool for purposes of both simulation of a circuit design and hardware co-simulation of the circuit design. Since the same design tool may be used for simulation, hardware co-simulation, or both, the same set of test cases, signals, and/or test vectors can be used and applied through the design tool whether performing simulation or co-simulation. This reduces the overhead associated with design and maintenance of test cases and, further, allows designers to switch between simulation and hardware co-simulation in a more seamless manner.

Figure 1:
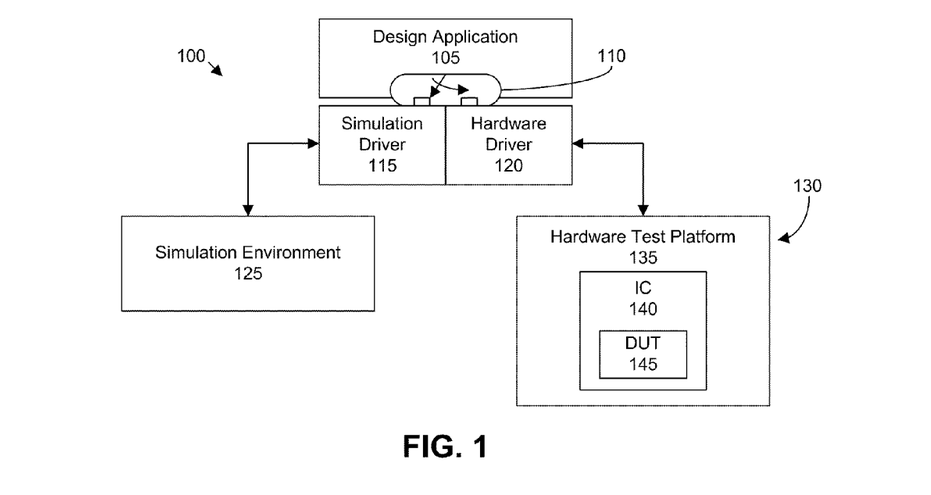
FIG. 1 is a schematic diagram illustrating a testing system in accordance with an embodiment of the present invention.

FIG. 1 is a schematic diagram illustrating a testing system 100 in accordance with one embodiment of the present invention. The testing system 100 can include a design application 105, a simulation driver 115, a hardware driver 120, and a simulation environment 125. Each of the components of system 100, e.g., the design application 105, the simulation driver 115, the hardware driver 120, the simulation environment 125, and the switch 110, can be implemented within software and execute within a suitable data processing system, e.g., one or more computer systems, whether workstations, portable computers, servers, other types of computing systems, or any combination thereof.

The design application 105 may be any of a variety of applications that provide functions relating to the design, implementation, testing, and/or verification of a circuit design to be implemented within an IC. For example, the design application 105 may be ChipScope™ Pro, System Generator™ for DSP, or Xilinx® Microprocessor Debugger (XMD), each of which is commercially available from Xilinx, Inc. of San Jose, Calif. (Xilinx, ChipScope, and System Generator are trademarks of Xilinx, Inc. in the United States, other countries, or both.) The IC within which the circuit design can be implemented can be a programmable logic device (PLD) including, but not limited to, a field programmable gate array (FPGA).

The simulation driver 115 can facilitate communication between the design application 105 and the simulation environment 125. For example, the simulation driver 115 can support transaction control protocol (TCP)-based transactions thereby allowing the design application 105 and the simulation environment 125 to communicate. The simulation environment 125 represents a purely software-based simulation environment executing within one or more information processing systems. For example, the simulation environment 125 can include a test bench having a simulation engine and the necessary hardware description language (HDL) code to execute a programmatic description of the circuit design to be tested, e.g., the device under test (DUT). The simulation environment 125 will be described herein in greater detail with reference to FIGS. 2-4.

Testing system 100 also can be coupled to a hardware co-simulation system 130. As used herein, "hardware co-simulation" refers to testing that involves a hardware platform that includes a physical IC within which the circuit design to be tested has been implemented. The IC, being loaded with the circuit design, can be tested through the use of the design application 105. The actual functioning IC is tested.

The testing system 100 can be linked to the hardware co-simulation system 130 via a physical communication link, whether a universal serial bus (USB) connection, an Ethernet connection, or the like. In this regard, the hardware driver 120 can serve as an interface between the design application 105 and the physical connection, e.g., cable, to the hardware co-simulation system 130. The hardware co-simulation system 130 can include a hardware test platform 135, e.g., a circuit board, upon which IC 140 can be mounted or otherwise disposed. As noted, the IC 140 can be a PLD such as an FPGA. The circuit design to be tested, referred to as the DUT 145, can be implemented, e.g., synthesized, within IC 140.

As is known, the IC 140 can include a Joint Test Action Group (JTAG) compliant interface, also known as an interface compliant with IEEE Standard 1149.1. JTAG specifies an interface and signaling for communicating with and controlling pins of compliant devices disposed upon a printed circuit board, e.g., hardware platform 135. Such an interface supports communications with a host computing system, such as one executing the design application 105 and the hardware driver 120.

As shown, the design application 105 can include a switch module 110 that, responsive to one or more parameters specifiable through the design application 105, for example, can select either the simulation driver 115 or the hardware driver 120. Based upon such parameter(s), any communications or instructions relating to simulation or hardware co-simulation can be directed either to the simulation driver 115 or the hardware driver 120.

For example, when a designer intends on simulating a circuit design, a parameter within or external to the design application 105, but readable by the design application 105, can be set so that the switch module 110 selects the simulation driver 115. This causes any simulation instructions originating from the design application 105 to be provided to the simulation driver 115 and to the simulation environment 125. By comparison, when a designer wishes to perform hardware co-simulation, the parameter(s) can be set so that the switch module 110 selects the hardware driver 120. Selection of the hardware driver 120 can cause any simulation instructions originating in the design application 105 to be provided to the hardware driver 120 and to the hardware co-simulation system 130. Test results output from either the simulation environment 125 or the hardware co-simulation system 130 can be received by the appropriate driver and provided to the design application 105 according to the parameter(s).

By appropriately setting one or more parameters or preferences via the design application 105, a designer may dynamically switch between simulation and hardware co-simulation of a circuit design. Thus, the designer may apply both types of testing techniques to a circuit design from a same design application and further apply the same set of test cases to both simulation and hardware co-simulation. Accordingly, the design application 105 can function in the same manner whether working in conjunction with a simulation environment 125 or a hardware co-simulation system 130. The designer can benefit from working through the same application, using a same interface, and interacting with a software DUT or a hardware DUT, e.g., DUT 145, using the same instructions whether implementing simulation or hardware co-simulation.

Figure 2:
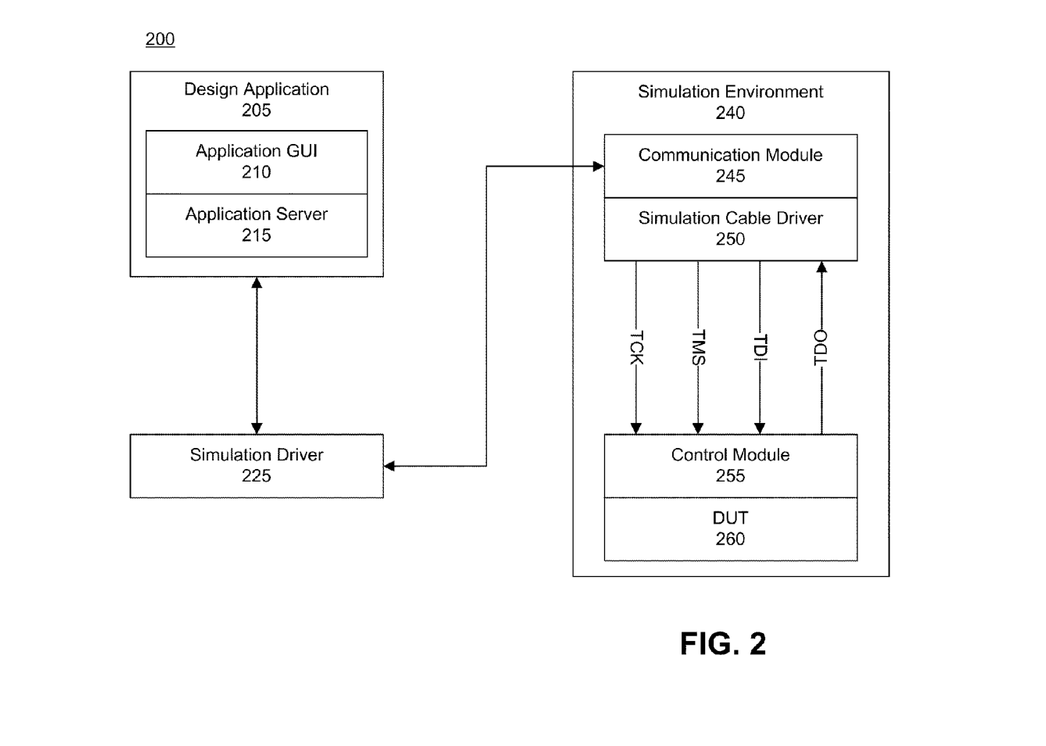
FIG. 2 is a schematic diagram illustrating a testing system in accordance with an embodiment of the present invention.

FIG. 2 is a schematic diagram illustrating a testing system 200 in accordance with another embodiment of the present invention. The testing system 200 can include a design application 205, a simulation driver 225, and a simulation environment 240. The design application 205, the simulation driver 225, and the simulation environment 240 can be implemented substantially as described with reference to FIG. 1. For purposes of clarity, however, neither a hardware driver nor the switch module is shown in FIG. 2, though such components may be included.

In one embodiment, the design application 205 can include an application graphical user interface (GUI) 210 which can receive input from a designer and output information, including test data obtained from a DUT 260. As used herein, "outputting" and/or "output" can mean, for example, writing to a file, writing to a user display or other output device, playing audible notifications, sending or transmitting to another system, exporting, or the like. The design application 205 further can include an application server 215 that can include application logic. The application server 215 can respond to requests received from the application GUI 210 and further interact with the simulation driver 225.

The design application 205 can communicate with the simulation driver 225. The simulation driver 225 can receive simulation instructions generated by the design application 205, e.g., as received from the application server 215, and translate the instructions into a control protocol instruction according to a specified control protocol. Each control protocol instruction can specify an operation to be performed as defined by the control protocol. In one embodiment, the control protocol can be an IC control protocol used for testing, verifying, and otherwise communicating with ICs and/or other boards. For example, the IC control protocol can be that specified by JTAG.

The simulation driver 225 further can encode instructions received from the design application 205 according to TCP or another communication protocol and prepare the instructions for transmission to the simulation environment 240. The simulation driver 225 further can decode any communications received from the simulation environment 240. For example, the simulation driver 225 can packetize and de-packetize control protocol instructions.

Accordingly, the simulation driver can send and receive data via a TCP communication link with the simulation environment 240. For example, any instructions from the design application 205 can be translated into a control protocol command, formatted for transmission using a communications protocol, and communicated to the simulation environment 240. Any simulation data from the DUT 260 also can be received from the simulation environment 240 by the simulation driver 225. Data that may be generated by the simulation environment 240 itself also can be communicated to the design application 205 via the simulation driver 225.

As shown, the simulation environment 240 can include a communication module 245, a simulation cable driver 250, a control module 255, as well as the DUT 260. The simulation environment 240, as noted, can include one or more HDL descriptions that facilitate simulation of the DUT 260. As noted, the DUT 260 can be implemented as a programmatic circuit description. The communication module 245 can respond to requests from the simulation driver 225. Instructions received by the communication module 245 can be decoded, in terms of TCP processing, and provided to the simulation cable driver 250. The communication module 245 further can encode data received from the simulation cable driver 250 to be sent to the design application 205.

The simulation cable driver 250 can process, e.g., encode, received instructions and output the instructions to the control module 255 in a format that conforms to the selected IC control protocol, e.g., JTAG. For example, the simulation cable driver 250 can receive a control protocol instruction specifying an operation to be performed and translate the instruction into a format that utilizes the actual ports specified by JTAG. As pictured, the control module can include a test clock (TCK) port, a test mode select (TMS) port, and a test data input (TDI) port through which the translated control protocol instruction can be output. The simulation cable driver 250 further can include a test data output (TDO) port.

Each port, though a virtual representation of a physical port, can perform and convey substantially the same information as a physical implementation of a JTAG module. For example, the control module 255 can be implemented such that the TCK port can receive information that controls the timing of the control module 255. The TMS port can receive information that controls the transitions of the control module 255 state. The TDI port can receive information that provides test data to JTAG registers, including shift registers, implemented programmatically within the control module 255. The TDO port can provide test data that is output from the control module 255, e.g., any output data generated by operation or simulation of the DUT 260.

Accordingly, the control module 255 can output encoded instructions to the DUT 260. The encoded instructions can be executed by the DUT 260 in combination with the simulation environment. Any output data generated by the DUT 260 can be output from the DUT 260 to the control module 255. Such data can be output to the simulation cable driver 250 via the TDO port.

Figure 3:
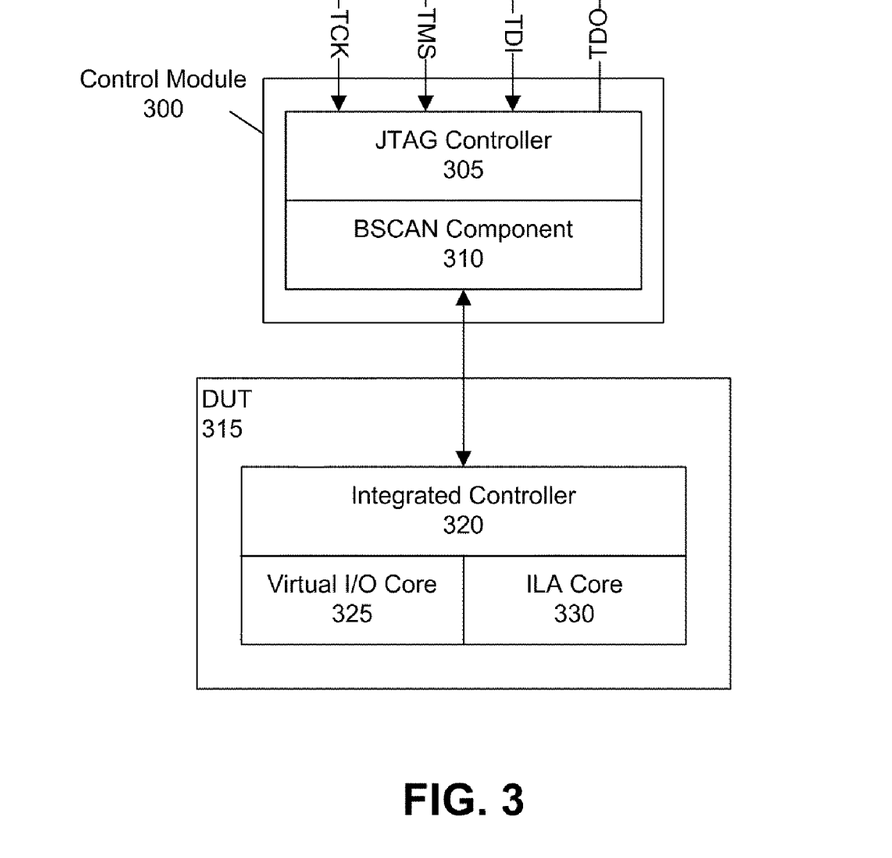
FIG. 3 is a schematic diagram illustrating a control module in accordance with an embodiment of the present invention.

FIG. 3 is a schematic diagram illustrating a control module 300 in accordance with another embodiment of the present invention. The control module 300 can be implemented substantially as described with reference to the control module 255 of FIG. 2. In the pictured example, the control module 300 can include a JTAG controller 305 and a BSCAN component 310.

The JTAG controller 305 can be a software-based processor that provides the various registers typically associated with a hardware-based JTAG controller. The JTAG controller 305, for example, can receive simulation instructions via the TCK, TMS, and TDI ports and output information via the TDO port.

The BSCAN component 310 can provide the interface necessary for coupling the JTAG controller 305 with the DUT 315. The BSCAN component 310 can provide a connection with the DUT 315 via the cores to be described herein. The BSCAN component 310 can receive control signals from the JTAG controller 305 and provide the signals to the DUT 315. Signals such as the JTAG clock (TCK) can be passed through the BSCAN component 310 so as to be available to cores incorporated within the DUT 315. The BSCAN component 310 further can make the TDI and TDO signals available on an output port to the DUT 315.

Prior to the embodiments disclosed herein, conventional simulation systems included no functional equivalent for the physical BSCAN component used in hardware co-simulation. Thus, during simulation, signals could be linked to ports or software representations of pins of the BSCAN component that passed signals without applying any of the functionality available in the physical BSCAN component used during hardware co-simulation. In consequence, simulation provided only a rough approximation of the signaling taking place during hardware co-simulation, e.g., as a result of the hardware BSCAN component. Often, problems identified during hardware co-simulation could not be reliably reproduced in simulation, leading to guesswork as to whether the problems were related to the DUT or the configuration of the hardware co-simulation platform, e.g., a problem with the JTAG controller 305, the BSCAN component 310, or the cores to be described herein within the DUT 315.

In one embodiment, the BSCAN component 310 provides a reduced set of JTAG functions as compared to a hardware or physical BSCAN component within a hardware co-simulation system. By limiting the functionality to those functions needed for communicating with the DUT, other functions that expose inner-workings of the physical target device, in this case a programmatic DUT 315, can be avoided.

The BSCAN component 310 can provide additional output signals to the integrated controller 320. In one embodiment, in place of the TMS signal, a select line signal and a scan signal can be output. The select line signal and the scan signal can be active, e.g., set high, when the BSCAN component 310 is accessed through JTAG pins (virtual pins) of the host IC. Accordingly, when a JTAG command sequence is provided to the BSCAN component 310, the select line from the BSCAN component 310 can be set high and the TDI pin of the host IC, e.g., the FPGA, can be connected to the TDI output of the BSCAN component 310. The TDO port of the BSCAN component 310 also can drive the TDO pin of the host IC. The select line signal can be controlled through the JTAG controller 305. The JTAG controller 305 also can multiplex other TDI/TDO accesses (signals) not in the fabric portion of the design, e.g., the integrated circuit (chip) identification (ID) code.

As shown, the DUT 315 can include an integrated controller 320, a virtual I/O core 325, and an ILA core 330. In general, a "core" refers to a predetermined, programmatic description of circuitry that implements a function. In this case, a core can refer to a programmatic description of circuitry that may be included within the DUT 315 and executed within the simulation environment as part of the DUT 315. The integrated controller 320 can provide a custom interface between the BSCAN component 310 and the virtual I/O core 325 and the ILA core 330. The virtual I/O core 325 can provide an interface through which the design application can control particular portions or aspects of the DUT 315. For example, the virtual I/O core 325 allows one or more portions of the DUT 315 to be activated or selectively engaged.

The ILA core 330 can function as a logic analyzer. The ILA core 330 allows a designer, working through the design application, to monitor signals within the DUT. These signals can be stored as part of a trace buffer within the ILA core 330. Accordingly, the ILA core 330 provides a mechanism for viewing and/or observing the manner in which signals change over time within the DUT 315. The ILA core 330 further can provide several controls and triggers relating to special events that may be detected within the DUT 315. These controls and triggers, for example, allow a designer to observe the operation of various components, e.g., buses, and determine when such components are violating design specifications.

It should be appreciated that the user design to be tested, e.g., the DUT 315, can be processed or instrumented with the necessary code to implement the integrated controller 320, the virtual I/O core 325, and the ILA core 330. Once instrumented with the necessary cores, the DUT 315 can be processed so that the modules discussed are integrated within the DUT 315 and facilitate communication with the design application (not shown) via the control module 300.

Figure 4:
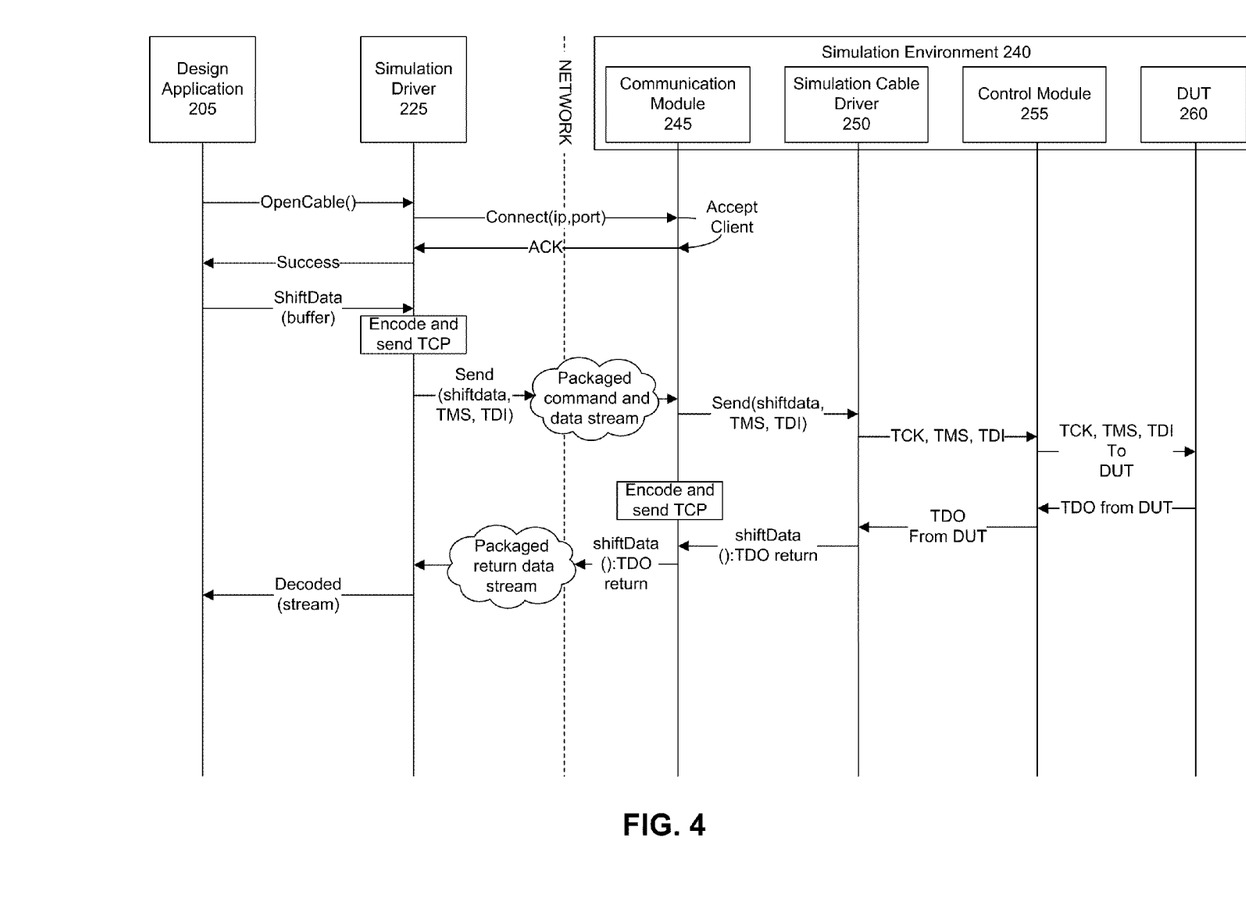
FIG. 4 is a signaling diagram illustrating communication among components of the testing system described with reference to FIG. 2 in accordance with another embodiment of the present invention.

FIG. 4 is a signaling diagram illustrating communication among components of the testing system described with reference to FIGS. 1-3 in accordance with another embodiment of the present invention. The simulation environment 240 can be instantiated or start to execute. Upon startup, the simulation environment 240 can invoke a "startServer( )" function. The "startServer( )" function starts the communication module 245 executing and listening to client socket requests.

Simulation can begin when a request is received from the design application 205 after the simulation environment 240 is executing. From the design application 205, a user can choose to perform simulation of a circuit design. Responsive to such an input, the design application 205 can call an "openCable( )" function within the simulation driver 225. The simulation driver 225 can issue a "connect" request to the simulation environment 240, and particularly to the communication module 245, which is listens for connection requests once executing.

The communication module 245, upon receiving the request for a connection, can call an "acceptClient" function to establish a TCP connection. Once established, the communication module 245 can provide an acknowledgement to the simulation driver 225 that the port has been opened. A simulation session of the design application 205 can begin when the socket between the simulation driver 225 is opened and terminate when the socket is closed. It should be appreciated, however, that the DUT 260 may continue to run outside of the simulation session.

After communication is established between the simulation driver 225 and the communication module 245, thereby creating a communication link between the design application 205 and the simulation environment 240, the simulation session can begin. From the design application 205, a user can initiate a simulation action by sending any of a variety of high level simulation instructions including, but not limited to, ShiftIR( ), ShiftDR( ), and NavigateState( ). The instructions can place the JTAG controller in a particular state and cause information to be shifted into or out of the DUT 260.

Thus, as shown, the design application 205 can send a simulation instruction such as "ShiftData(buffer)". The simulation driver 225 can translate the instruction received from the design application 205 into a control protocol instruction that specifies an operation to be performed according to the specified control protocol. For example, the instruction from the design application 205 can be translated into a control protocol (JTAG) instruction specifying an operation to be performed. The control protocol instruction can be, for example, "send(shiftdata,TMS,TDI)". The simulation driver 225 further can encode the translated instruction according to TCP for transmission to the simulation environment 240. The simulation driver 225 can forward the instruction to the communication module 245.

The communication module 245 can decode the packetized control protocol instruction received from the simulation driver 225 and provide a decoded stream to the simulation cable driver 250. For example, the communication module 245 can send the de-packetized control protocol instruction "shiftData(TMS,TDI)" to the simulation cable driver 250. The simulation cable driver 250 can convert the received control protocol instruction into the appropriate control protocol signals, e.g., TCK, TMS, and TDI formatted signaling information, that are required by the control module 255 and the DUT 260. The signaling information can be provided as a TCK vector, a TMS vector, and a TDI vector.

A response from the DUT, e.g., test data, can be provided back through the control module 255, e.g., the BSCAN component and the JTAG controller, to the simulation cable driver 250 as TDO signaling information, e.g., a TDO vector. The simulation cable driver 250 can reformat the data as a control protocol response comprising data, e.g., a "shiftData( ):TDO return" instruction, and provide the resulting data to the communication module 245.

The communication module 245 can encode the response from the simulation cable driver 250 according to a communication protocol, e.g., TCP, and transmit the control protocol command to the simulation driver 225. The simulation driver 225 can decode the response from the communication module 245, e.g., de-packetize, and provide the data to the design application 205 for output.

At some future point, when simulation is no longer desired, the design application can issue a "CloseCable( )" instruction to the simulation driver 225. The simulation driver 225 can inform the communication module 245 of the port closure. The communication module 245 can invoke a "close" function thereby closing the communication port with the simulation driver 225.

The embodiments disclosed herein provide for layers of abstraction that allow a design application to function in the same manner whether working in conjunction with a simulation environment or a hardware co-simulation environment. As such, a designer may test and evaluate circuit designs in both software and hardware using a same design application.

In addition, the embodiments disclosed herein provide a simulation environment that accurately reflects the functionality of hardware co-simulation interfaces such as JTAG. Accordingly, the designer can expect the same view and functionality whether simulating a circuit design or conducting hardware co-simulation with a physical DUT. Separate developmental effort to replicate, through complex test benches, the functionality of JTAG components of hardware co-simulation within a simulation environment is no longer required.

The block diagrams and signal flow diagram in the figures illustrate the architecture, functionality, and operation of possible implementations of systems, methods and computer program products according to various embodiments of the present invention. In this regard, each block in the figures may represent a module, segment, or portion of code, which comprises one or more portions of computer-usable program code that implements the specified logical function(s).

It should be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It also should be noted that each block and/or combination of blocks in the figures can be implemented by special purpose hardware-based systems that perform the specified functions or acts, or combinations of special purpose hardware and computer instructions.

Embodiments of the present invention can be realized in hardware, software, or a combination of hardware and software. The embodiments can be realized in a centralized fashion in one computer system or in a distributed fashion where different elements are spread across several interconnected computer systems. Any kind of computer system or other apparatus adapted for carrying out the methods described herein is suited. A typical combination of hardware and software can be a general-purpose computer system, e.g., a data processing system, with a computer-usable program code, e.g., a program that, when being loaded and executed, controls the data processing system such that it carries out the methods described herein.

A data processing system suitable for storing and/or executing computer-usable program code can include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output (I/O) devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems, and Ethernet cards are just a few of the currently available types of network adapters.

Embodiments of the present invention further can be embedded in a computer program product, which comprises all the features enabling the implementation of the methods described herein. The computer program product can include a computer-usable or computer-readable medium having computer-usable program code which, when loaded in a computer system, causes the computer system to perform the functions described herein. Examples of computer-usable or computer-readable media can include, but are not limited to, optical media, magnetic media, computer memory, one or more portions of a wired or wireless network through which computer-usable program code can be propagated, or the like.

The terms "computer program," "software," "application," "computer-usable program code," variants and/or combinations thereof, in the present context, mean any expression, in any language, code or notation, of a set of instructions intended to cause a system having an information processing capability to perform a particular function either directly or after either or both of the following: a) conversion to another language, code or notation; b) reproduction in a different material form. For example, a computer program can include, but is not limited to, a subroutine, a function, a procedure, an object method, an object implementation, an executable application, an applet, a servlet, a source code, an object code, a shared library/dynamic load library and/or other sequence of instructions designed for execution on a computer system.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising, i.e., open language. The term "coupled," as used herein, is defined as connected, although not necessarily directly, and not necessarily mechanically, e.g., communicatively linked through a communication channel or pathway or another component or system.

The embodiments disclosed herein can be embodied in other forms without departing from the spirit or essential attributes thereof. Accordingly, reference should be made to the following claims, rather than to the foregoing specification, as indicating the scope of the various embodiments of the present invention.

What is claimed is:

1. A method of testing a circuit design for implementation within an integrated circuit device, the method comprising:
   providing a simulation driver that communicatively links a design application with a communication module executing as part of a simulation environment for a device under test,
   wherein the simulation environment is software-based;
   establishing a communication link between the design application and the communication module via the simulation driver;
   providing a simulation cable driver executing as part of the simulation environment that communicates with the communication module and translates control protocol instructions specifying operations of an integrated circuit control protocol into signaling information conforming to the integrated circuit control protocol; and
   outputting the signaling information to the device under test within the simulation environment,
   wherein the simulation cable driver simulates physical ports of a hardware co-simulation system when communicating with the device under test within the simulation environment.

2. The method of claim 1, further comprising, responsive to detection of a parameter, dynamically switching between the simulation driver and a hardware driver that communicates with a hardware co-simulation system over a physical communication link.

3. The method of claim 2, further comprising providing a same simulation instruction from the design application to either the simulation driver or the hardware driver according to the parameter.

4. The method of claim 2, further comprising:
   receiving test data from the simulation environment or the hardware co-simulation system according to the parameter; and
   outputting the test data.

5. The method of claim 1, further comprising the simulation driver:
   translating simulation instructions from the design application into the control protocol instructions;
   encoding the control protocol instructions according to a communication protocol of the communication module; and
   communicating the encoded control protocol instructions to the communication module.

6. The method of claim 1, further comprising monitoring signals output from the device under test through a first software core embedded within the device under test.

7. The method of claim 1, further comprising setting at least one operational parameter of the device under test through a second software core embedded in the device under test responsive to a simulation instruction from the design application.

8. A computer-based system for testing a circuit design for implementation within an integrated circuit device, the system comprising:
   a processor coupled to memory elements storing program code that is executable by the processor, the system executing:
   a design application providing simulation instructions for testing a circuit design;
   a simulation driver receiving the simulation instructions from the design application and translating the simulation instructions into control protocol instructions specifying operations of an integrated circuit control protocol; and
   a simulation environment comprising:
      a communication module communicating with the simulation driver;
      a simulation cable driver receiving the control protocol instructions from the simulation driver via the communication module and translating the control protocol instructions into signaling information corresponding to the integrated circuit control protocol,
      wherein the simulation cable driver is configured to output the signal information over a plurality of virtual ports that simulate hardware co-simulation ports; and
      a control module configured to receive the signaling information over the plurality of virtual ports and output the signaling information to a device under test within the simulation environment.

9. The computer-based system of claim 8, wherein the simulation driver communicates with the communication module using a selected communication protocol, wherein the simulation driver encodes the control protocol instructions according to the selected communication protocol and decodes test data received from the simulation environment according to the selected communication protocol.

10. The computer-based system of claim 8, wherein the integrated circuit control protocol is Joint Test Action Group, wherein the signaling information comprises test clock input signals, test mode select input signals, and test data input signals.

11. The computer-based system of claim 8, wherein the control module comprises a Joint Test Action Group controller and the plurality of virtual ports comprise a test clock port, a test mode select port, and a test data input port.

12. The computer-based system of claim 11, wherein the plurality of virtual ports comprise a test data output port through which test data from the simulated device under test is output.

13. The computer-based system of claim 8, further comprising a hardware driver, wherein, responsive to detection of a parameter, the design application dynamically selects, and provides the simulation instructions to, either the hardware driver or the simulation driver, thereby establishing communication with a simulation environment or the hardware co-simulation system.

14. A computer-usable medium having computer-usable instructions written thereon for implementing a method of testing a design for implementation within an integrated circuit device, the method comprising:

implementing a simulation driver that communicatively links a design application with a communication module executing as part of a simulation environment for a device under test, wherein the simulation environment is software-based;

establishing a communication link between the design application and the communication module via the simulation driver;

implementing a simulation cable driver executing as part of the simulation environment that communicates with the communication module and translates control protocol instructions specifying operations of an integrated circuit control protocol into signaling information conforming to the integrated circuit control protocol; and outputting the signaling information to the device under test within the simulation environment, wherein the simulation cable driver simulates physical ports of a hardware co-simulation system when communicating with the device under test within the simulation environment.

15. The computer-usable medium of claim 14, wherein the method further comprises:

dynamically switching between the simulation driver and a hardware driver that communicates with a hardware co-simulation system over a physical communication link responsive to detection of a parameter.

16. The computer-usable medium of claim 15, wherein the method further comprises:

providing a same simulation instruction from the design application to either the simulation driver or the hardware driver according to the parameter.

17. The computer-usable medium of claim 14, wherein the method further comprises:

receiving test data from the simulation environment or the hardware co-simulation system according to the parameter; and outputting the test data.

18. The computer-usable medium of claim 14, wherein the method further comprises:

translating simulation instructions from the design application into the control protocol instructions;

encoding the control protocol instructions according to a communication protocol of the communication module; and computer-usable program code that communicates the encoded control protocol instructions to the communication module.

19. The computer-usable medium of claim 14, wherein the method further comprises:

implementing a software core embedded in the device under test that monitors signals output from the device under test.

20. The computer-usable medium of claim 15, wherein the method further comprises:

implementing a second software core embedded in the device under test that sets at least one operational parameter of the device under test responsive to a simulation instruction from the design application.

* * * * *